(12) United States Patent
Choi et al.

(10) Patent No.: US 8,243,495 B2
(45) Date of Patent: Aug. 14, 2012

(54) PHASE-CHANGE RANDOM ACCESS MEMORY CAPABLE OF REDUCING WORD LINE RESISTANCE

(75) Inventors: Byung-gil Choi, Yongin-si (KR); Won-ryul Chung, Hwaseong-si (KR); Beak-hyung Cho, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 778 days.

(21) Appl. No.: 12/379,399

(22) Filed: Feb. 20, 2009

(65) Prior Publication Data

US 2009/0213647 A1   Aug. 27, 2009

(30) Foreign Application Priority Data

Feb. 21, 2008 (KR) .................... 10-2008-0015919

(51) Int. Cl.
  *G11C 11/00* (2006.01)
(52) U.S. Cl. .............. 365/148; 365/163; 365/230.06
(58) Field of Classification Search .............. 365/148, 365/163, 230.06, 51, 63
  See application file for complete search history.

(56) References Cited

U.S. PATENT DOCUMENTS

| 6,317,353 | B1 * | 11/2001 | Ikeda et al. ............... 365/63 |
| 2008/0013397 | A1 * | 1/2008 | Park et al. ............ 365/230.06 |
| 2008/0180981 | A1 * | 7/2008 | Park et al. .................. 365/51 |

FOREIGN PATENT DOCUMENTS

| JP | 07-211069 | 8/1995 |
| JP | 2007-227547 | 9/2007 |
| KR | 10-2006-0075423 | 7/2006 |

* cited by examiner

*Primary Examiner* — Richard Elms
*Assistant Examiner* — Hien Nguyen
(74) *Attorney, Agent, or Firm* — Harness, Dickey & Pierce, P.L.C.

(57) ABSTRACT

A phase-change random access memory (PRAM) device capable of reducing a resistance of a word line may include a plurality of main word lines of a semiconductor memory device or PRAM bent n times in a layer different from a layer in which a plurality of sub-word lines are disposed. The semiconductor memory device or PRAM may further include jump contacts for connecting the plurality of cut sub-word lines. In a PRAM device including the plurality of main word lines and the plurality of sub-word lines being in different layers, the number of jump contacts for connecting the plurality of main word lines to a transistor of a sub-word line decoder is the same in each sub-word line or the plurality of main word lines are bent several times so that a parasitic resistance on a word line and power consumption may be reduced, and a sensing margin may be increased.

20 Claims, 9 Drawing Sheets

US 8,243,495 B2

PHASE-CHANGE RANDOM ACCESS MEMORY CAPABLE OF REDUCING WORD LINE RESISTANCE

PRIORITY STATEMENT

This application claims priority under 35 U.S.C. §119 to Korean Patent Application No. 10-2008-0015919, filed on Feb. 21, 2008, in the Korean Intellectual Property Office, the entire contents of which are incorporated herein by reference.

BACKGROUND

1. Field

Example embodiments relate to a semiconductor memory device, and more particularly, to a phase-change random access memory (PRAM) device including main word lines and sub-word lines connected to the main word lines, the main word lines and the sub-word lines being disposed in different layers, wherein each sub-word line (or each local word line) has the same number of jump contacts for connecting the main word lines (or global word lines) to a transistor of a sub-word line decoder, or the main word lines are bent several times so that a parasitic resistance on a word line may be reduced, a sensing margin may be increased, and power consumption may be reduced.

2. Description of the Related Art

A phase-change random access memory (PRAM) device is a type of non-volatile memory in which data is stored by using a material, e.g., germanium, antimony, and tellurium (GeSbTe), also referred to as GST, of which resistance changes according to a phase change corresponding to a temperature change (hereinafter, referred to as a phase-change material). The PRAM device has non-volatile and relatively low power consumption characteristics and includes all advantages of a dynamic random access memory (DRAM), thereby considered to be the next-generation memory.

FIG. 1 is an equivalent circuit diagram of a unit cell C of a conventional PRAM device. FIG. 2 is a cross-sectional view of a memory device ME including the phase-change material GST shown in FIG. 1. Referring to FIGS. 1 and 2, the PRAM device includes the memory device ME and a P-N diode (D) in a unit cell C. The phase-change material GST is connected to a bit line BL, which is connected to a p-junction of a diode D, and a word line WL, which is connected to an N-junction of the diode D. The PRAM device may include a transistor (not shown) which is connected to the phase-change material GST (not to the diode D illustrated in FIG. 1).

The memory device ME includes the phase-change material GST. The phase-change material GST is in a crystalline or amorphous state in the unit cell C of the PRAM device according to temperature and heating time so that information may be stored in the unit cell C of the PRAM device. A relatively high temperature above 900° C. is required for phase-change of the phase-change material GST, obtained by Joule heating in response to a current that flows through a phase-change memory cell.

When the current is supplied to a lower electrode BEC of the memory device ME, the volume and state of PGM, which is a contact portion between the phase-change material GST and the lower electrode BEC, is changed according to the current. A change in PGM allows the crystalline state of the phase-change material GST to be determined.

FIG. 3 is a graph showing time (in seconds) versus temperature (TMP), which represents the characteristic of the phase-change material GST of FIGS. 1 and 2. Reference numeral "CON1" of FIG. 3 represents a condition on which the phase-change material GST is in an amorphous state, and reference numeral "CON0" of FIG. 3 represents a condition on which the phase-change material GST is in a crystalline state. A write operation and a read operation in the PRAM device will be described with reference to FIGS. 1 through 3.

First, the write operation will be described. When the phase-change material GST is rapidly cooled after the phase-change material GST is heated to above a melting temperature TMP2 (t1), the phase-change material GST enters an amorphous state. Such an amorphous state is defined as information "1". This state is also called a reset state. In order to store information "0", the phase-change material GST is slowly cooled after the phase-change material GST is heated to above a crystallization temperature TMP1 and is kept at that temperature for a predetermined or given amount of time (t2). In this case, the phase-change material GST enters a crystalline state. Such a crystalline state is defined as information "0". This state is also called a set state.

The read operation will be described. A memory cell C to be read is selected by selecting a bit line BL and a word line WL, which correspond to each other. A read current is supplied to the selected memory cell C, and values "1" and "0" are discriminated as a difference in a voltage change due to a resistance state of the phase-change material GST.

However, when a write or read operation into or from the selected memory cell C is performed, and a parasitic resistance R illustrated in FIG. 1 exists in the word line WL, a sensing margin may be reduced or a cell current required for a write or read operation may be increased. The parasitic resistance R that exists in the word line WL may depend on several factors. Hereinafter, an increase in a word line resistance due to jump contacts between a main word line and a sub-word line driver, which is one factor for increasing word line resistance, will be described.

FIG. 4 illustrates a PRAM device in which main word lines and sub-word lines are disposed on the same layer. Referring to FIG. 4, main word lines MWL0 and MWL1 are disposed on the same layer on which eight sub-word lines SWL0 to SWL7 and SWL8 to SWL15, corresponding to one another, are disposed. Thus, data cannot be stored in memory cells of an area ARE1 in which the main word lines MWL0 and MWL1 are disposed. In other words, cells that exist in the area ARE1 in which the main word lines MWL0 and MWL1 are disposed become dummy cells.

SUMMARY

Example embodiments provide a semiconductor memory device, e.g., a phase-change random access memory (PRAM) device, in which a parasitic resistance on a word line may be reduced, a sensing margin may be increased and power consumption may be reduced.

According to example embodiments, a semiconductor memory device may include a plurality of sub-word lines in a first layer; a plurality of main word lines in a second layer and connected to the corresponding sub-word lines of the plurality of sub-word lines; a plurality of sub-word line decoders in a layer different from the second layer, connected to the corresponding plurality of sub-word lines and plurality of main word lines, and configured to activate the plurality of sub-word lines corresponding to external addresses and connected to the plurality of sub-word line decoders; and jump contacts for connecting the plurality of sub-word lines.

In example embodiments, the first layer and the second layer may be different layer and may be formed of a metal. Each of the plurality of sub-word lines may include jump contacts in the same number as the number of the plurality of sub-word lines. At least one main word line of the plurality of main word lines may be bent n times (where n is a natural number), wherein n corresponds to the number of the plurality of sub-word lines connected to the respective plurality of main word lines. When the plurality of main word lines are connected to first through m (where m is a natural number) of the plurality of sub-word lines sequentially disposed, at least one main word line of the plurality of main word lines may be in a stair shape that sequentially descends from the first sub-word line to the m-th sub-word line. When the plurality of main word lines are connected to first through m (where m is a natural number) of the plurality of sub-word lines sequentially disposed, at least one main word line of the plurality of main word lines may be in a stair shape that sequentially ascends from the m-th sub-word line to the first sub-word line.

In example embodiments, each of the plurality of sub-word lines may be cut to a given length so that the plurality of main word lines can be connected to the plurality of sub-word line decoders in a region in which the corresponding plurality of sub-word line decoders are disposed. The cut region of each of the plurality of sub-word lines may be connected in the second layer. The semiconductor memory device may be a phase-change random access memory (PRAM) device.

According to example embodiments, a semiconductor memory device may include a plurality of sub-word lines in a first layer; and a plurality of main word lines in a second layer and connected to corresponding sub-word lines of the plurality of sub-word lines, wherein at least one main word line of the plurality of main word lines is bent n times (where n is a natural number).

In example embodiments, the first layer and the second layer may be different layers and may be formed of a metal. The natural number n corresponds to the number of the plurality of sub-word lines connected to the respective plurality of main word lines. When the plurality of main word lines are connected to first through m (where m is a natural number) of the plurality of sub-word lines sequentially disposed, at least one main word line of the plurality of main word lines may be in a stair shape that sequentially descends from the first sub-word line to the m-th sub-word line. When the plurality of main word lines are connected to first through m (where m is a natural number) of the plurality of sub-word lines sequentially disposed, at least one main word line of the plurality of main word lines may be in a stair shape that sequentially ascends from the m-th sub-word line to the first sub-word line.

In example embodiments, each of the plurality of sub-word lines may be in a different layer from a layer in which the plurality of main word lines are disposed and cut to a given length so that the plurality of main word lines can be connected to a sub-word line decoder activating the plurality of sub-word lines corresponding to external addresses. The PRAM may further include jump contacts for connecting the plurality of cut sub-word lines. Each of the plurality of sub-word lines may include the jump contacts in the same number as the number of the plurality of sub-word lines. The cut region of each of the plurality of sub-word lines may be connected in the second layer. The semiconductor memory device may be a phase-change memory device (PRAM).

In order to prevent or reduce dummy cells from occurring, a PRAM device in which main word lines are in a different layer from a layer on which corresponding sub-word lines are disposed may be realized. When a layer on which the main word lines are disposed is different from a layer on which the sub-word lines are disposed, the main word lines may include jump contacts for connecting the main word lines to a sub-word line decoder. However, when these jump contacts are concentrated on particular sub-word lines, a resistance in corresponding sub-word lines may increase.

BRIEF DESCRIPTION OF THE DRAWINGS

Example embodiments will be more clearly understood from the following detailed description taken in conjunction with the accompanying drawings.

FIG. 1 is an equivalent circuit diagram of a unit cell C of a conventional phase-change random access memory (PRAM) device;

FIG. 2 is a cross-sectional view of a memory device ME including the phase-change material GST shown in FIG. 1;

FIG. 3 is a graph showing time (in seconds) versus temperature (TMP), which represents the characteristic of the phase-change material GST of FIGS. 1 and 2;

FIG. 4 illustrates a PRAM device in which main word lines and sub-word lines are on the same layer;

FIG. 5 illustrates a PRAM device according to example embodiments;

FIG. 6 is a more detailed circuit diagram of the PRAM device of FIG. 5; and

FIGS. 7 through 10 illustrate various shapes of main word lines illustrated in FIG. 5 or 6, according to example embodiments.

Figure 1:
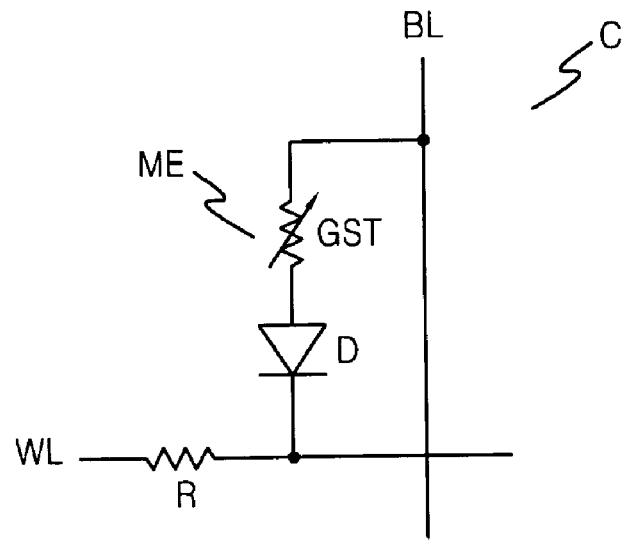
FIGS. 1-10 represent non-limiting, example embodiments as described herein.
Figure 2:
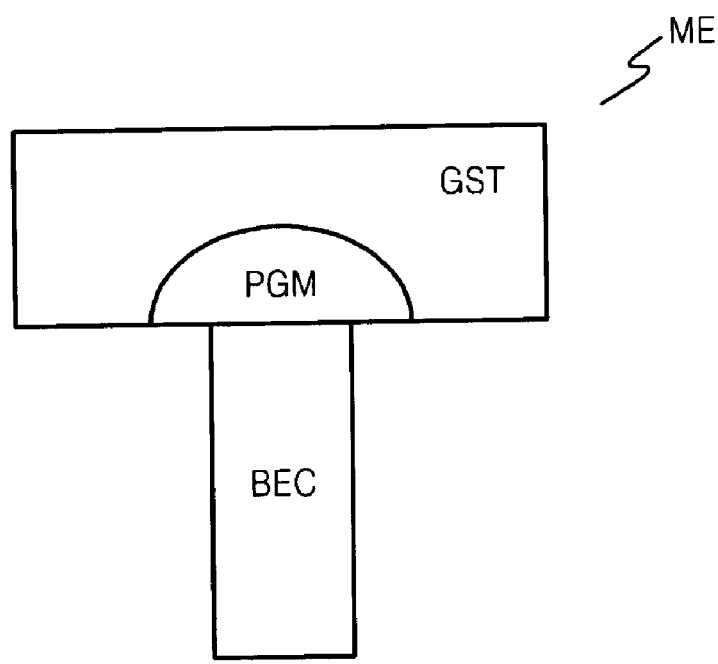
Figure 3:
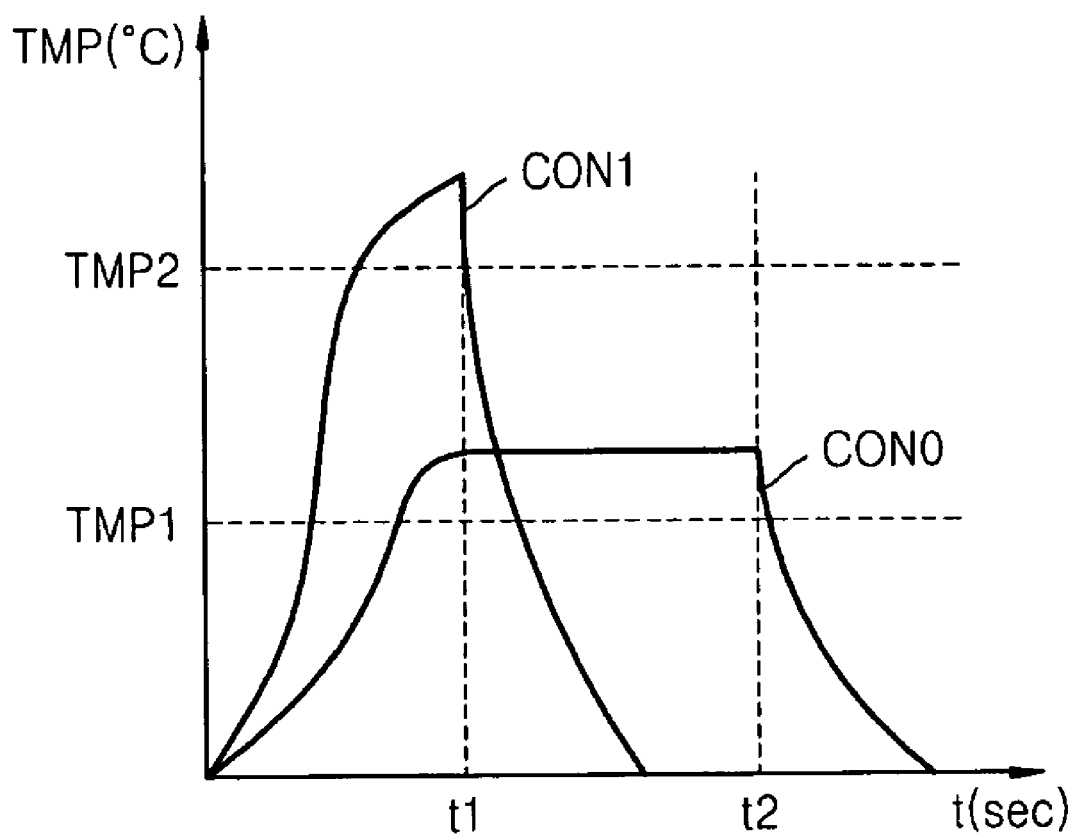

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Reference will now be made in detail to example embodiments, examples of which are illustrated in the accompanying drawings, wherein like reference numerals refer to the like elements throughout. In this regard, example embodiments may have different forms and should not be construed as being limited to the descriptions set forth herein. Accordingly, example embodiments are merely described below by referring to the figures. These example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms including technical and scientific terms used herein have the same meaning as commonly understood by one of ordinary skill in the art to which example embodiments belongs. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 5:
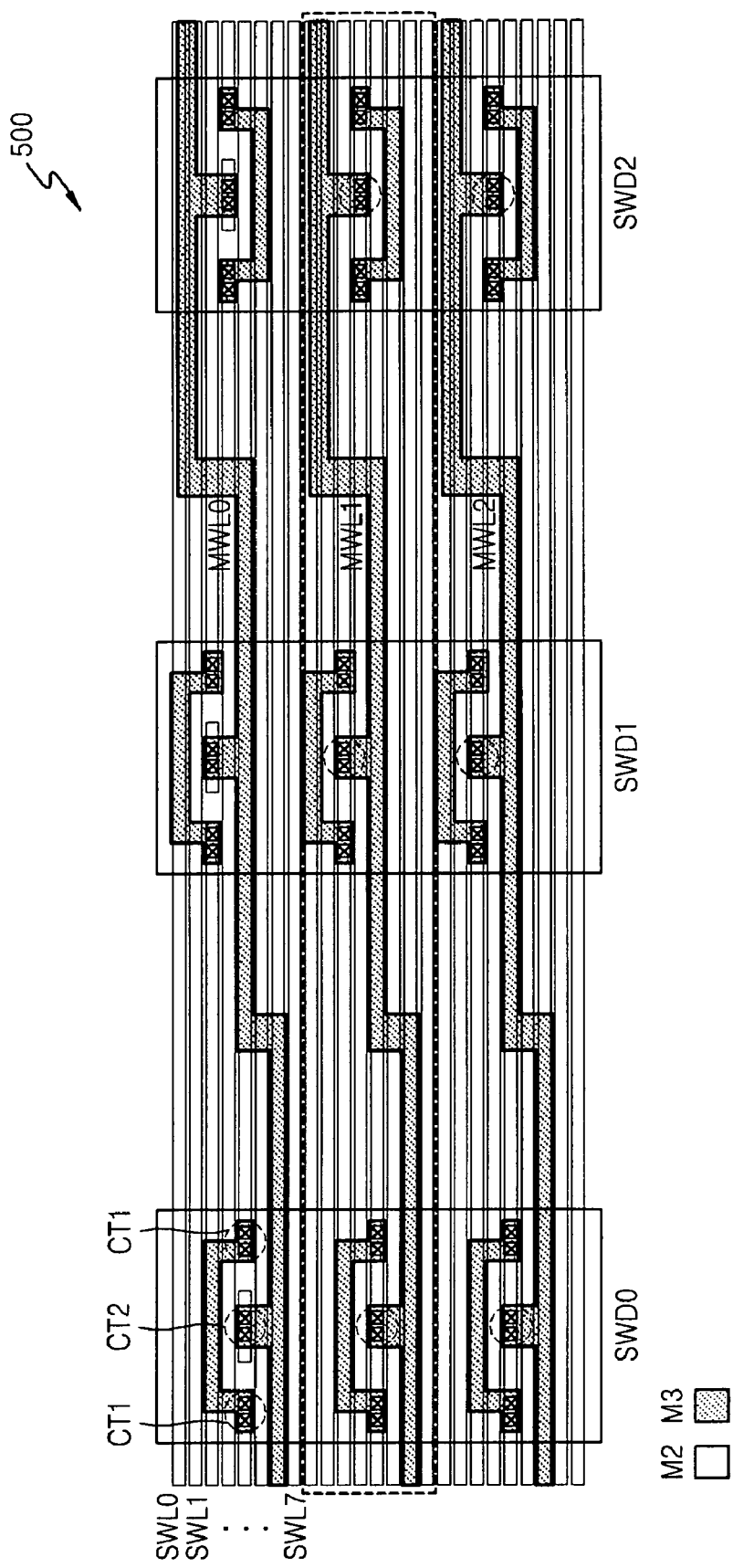

FIG. 5 illustrates a semiconductor memory device according to example embodiments. Referring to FIG. 5, a semiconductor memory device 500 according to example embodiments may be a phase-change random access memory (PRAM) device. The semiconductor memory device 500 according to example embodiments may include sub-word lines SWL0 to SWL7, main word lines MWL0 to MWL2, and sub-word line decoders SWD0 to SWD2, as illustrated in FIG. 5.

A plurality of sub-word lines may be connected to one main word line. For example, in the semiconductor memory device 500 of FIG. 1, the first main word line MWL0 may be connected to first through eighth sub-word lines SWL0 to SWL7. In example embodiments, the first through eighth sub-word lines SWL0 to SWL7 may be disposed in a first layer. The main word lines MWL0 to MWL2 may be disposed in a second layer. The first layer and the second layer may be formed of a metal and may be different layers.

Figure 4:
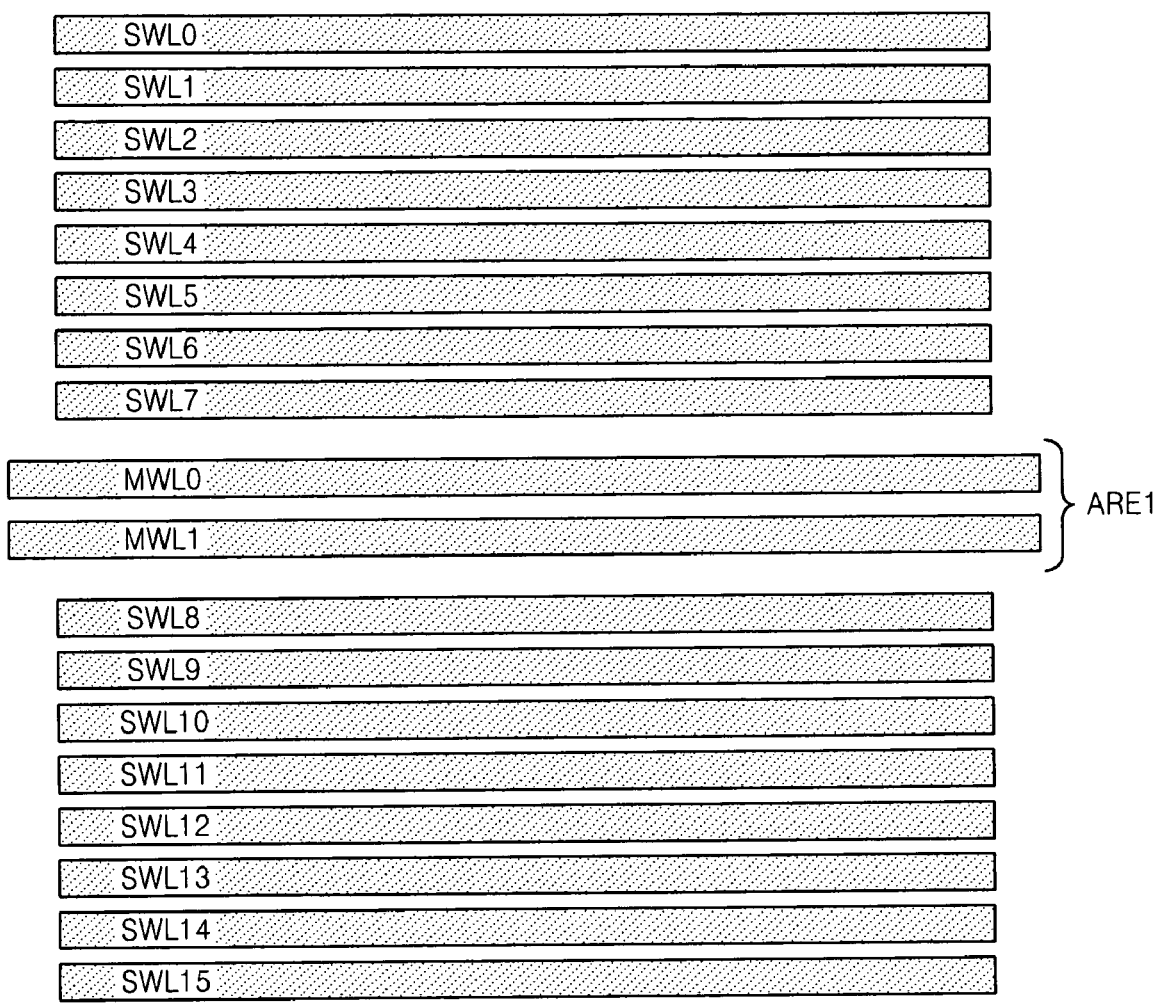

For example, the sub-word lines SWL0 to SWL7 may be disposed in a second metal layer M2, and the main word lines MWL0 to MWL2 may be disposed in a third metal layer M3. In this way, in the semiconductor memory device illustrated in FIG. 5, the sub-word lines and the main word lines may be disposed in different layers so that the occurrence of dummy cells as illustrated in FIG. 4 may be prevented or reduced.

Subsequently, referring to FIG. 5, the sub-word line decoders SWD0 to SWD2 may be connected to corresponding sub-word lines and corresponding main word lines, thereby activating sub-word lines which correspond to external addresses (not shown) among the connected sub-word lines. In example embodiments, the sub-word line decoders SWD0 to SWD2 may be disposed in a different layer from a layer in which the main word lines are disposed.

Thus, jump contacts CT2 for connecting the sub-word line decoders SWD0 to SWD2 to the main word lines MWL0 to MWL2 may be needed. However, as described above, the sub-word line decoders SWD0 to SWD2 may also be connected to the sub-word lines SWL0 to SWL7, which will be described in greater detail.

Figure 6:
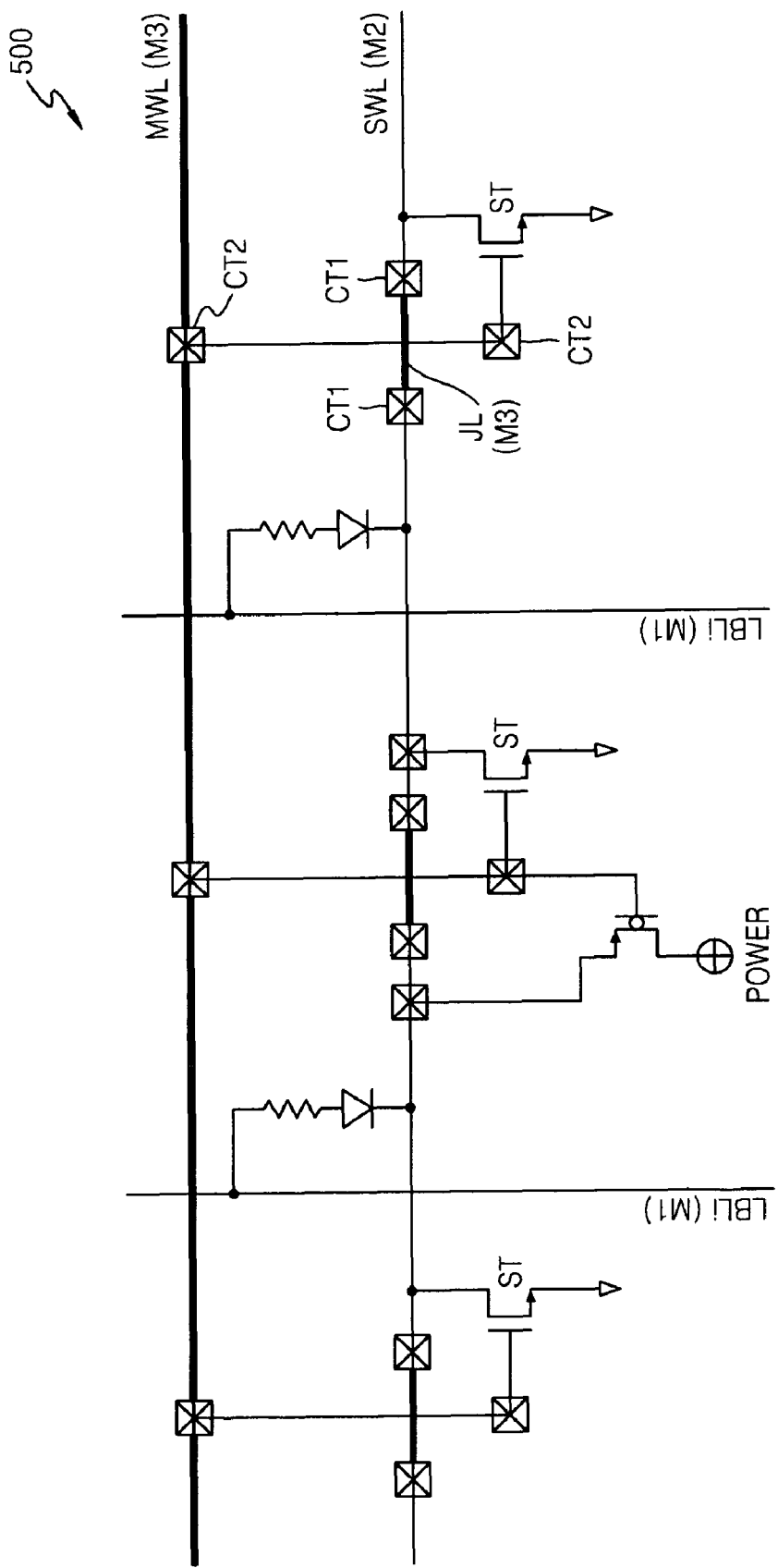

FIG. 6 is a more detailed circuit diagram of the semiconductor memory device of FIG. 5. Referring to FIGS. 5 and 6, a sub-word line SWL may be connected to a selection unit ST of a sub-word line decoder. In example embodiments, the selection unit ST may be a transistor which applies a write or read voltage (or current) to the sub-word line SWL that is gated due to an exteral address, and may be connected to the selection unit ST.

However, the main word line MWL, which is disposed in a different layer from a layer in which the sub-word line SWL is disposed, must pass a region in which the sub-word line SWL exists so that the main word line MWL may be connected to the selection unit ST of the sub-word line decoder. Thus, the sub-word line SWL may be cut to a predetermined or given length so that the main word line MWL may be connected to the sub-word line decoder or the selection unit ST of the sub-word line decoder in the region in which the sub-word line SWL (or the selection unit ST of the sub-word line decoder) exists.

The cut region of the sub-word line SWL may be connected by jump contacts CT1 and a junction line JL. In example embodiments, the junction line JL may be positioned not in a first layer M2 in which the sub-word line SWL is disposed but in a second layer M3 in which the main word line MWL is disposed, as illustrated in FIGS. 5 and 6. A bit line LBLi illustrated in FIG. 6 may be disposed in a third layer M1, which is different from the first layer M2 and the second layer M3.

However, the jump contacts CT1 may act as a resistance of a corresponding sub-word line. As described previously, a resistance that exists in the word line may cause a sensing margin of the semiconductor memory device to be reduced. In addition, the main word lines MWL0 to MWL2 of the semiconductor memory device 500 illustrated in FIG. 5 may be bent n times (where n is a natural number). When the main word line is a straight line, the jump contacts CT1 may be concentrated only on predetermined or given sub-word lines.

In other words, the main word lines MWL0 to MWL2 may be bent several times, as illustrated in FIG. 5, so as to prevent or reduce the jump contacts CT1 from being concentrated on the predetermined or given sub-word lines. Thus, the sub-word lines of the semiconductor memory device illustrated in FIG. 5 may include jump contacts having same number as the number of the sub-word lines.

In this way, in the semiconductor memory device illustrated in FIG. 5, e.g., in a phase-change random access memory (PRAM) device in which main word lines and sub-word lines to be connected to the main word lines are disposed in different layers, the main word lines may be bent several times so that the jump contacts for connecting the main word lines to a transistor of the sub-word line decoder may be dispersed into a plurality of sub-word lines.

Thus, in the semiconductor memory device illustrated in FIG. 5, the same number of jump contacts may be made in each sub-word line such that a parasitic resistance on the word line may be reduced, a sensing margin may be increased, a cell current required for a write or read operation may be reduced, and power consumption may be reduced.

Figure 7:
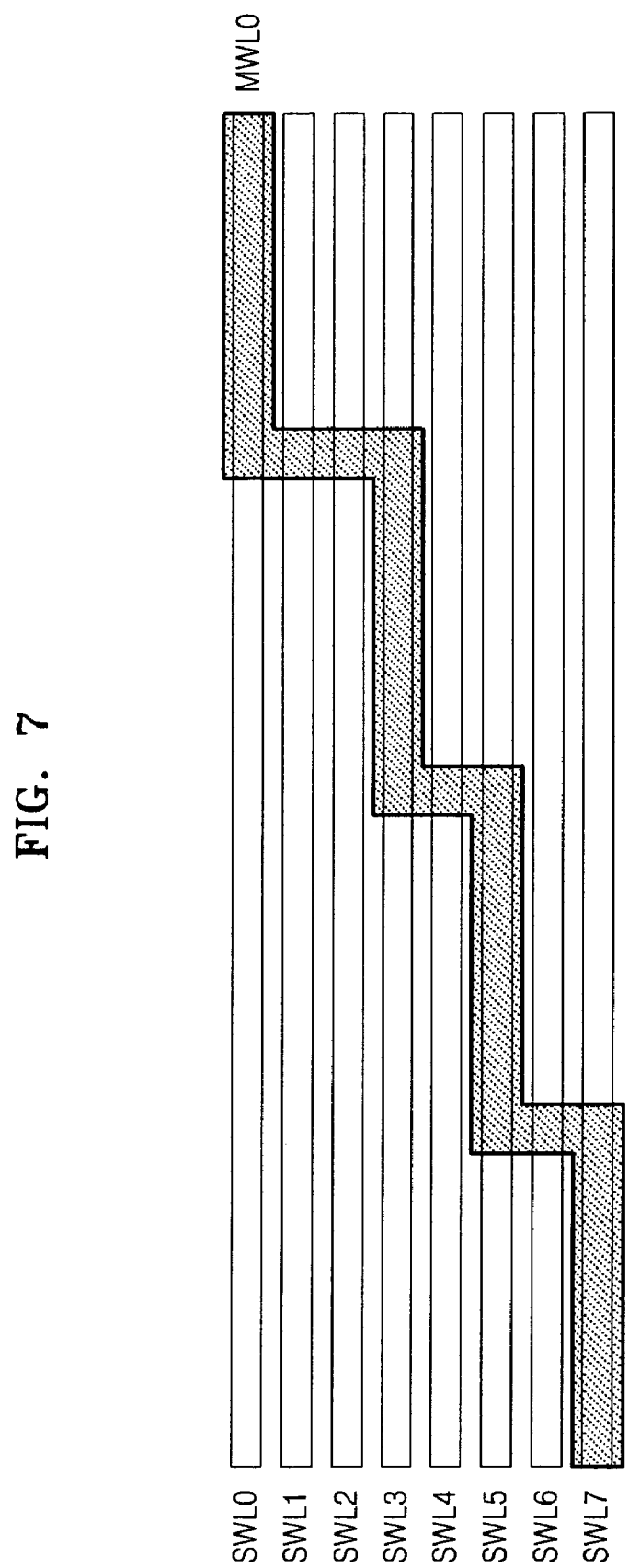
Figure 8:
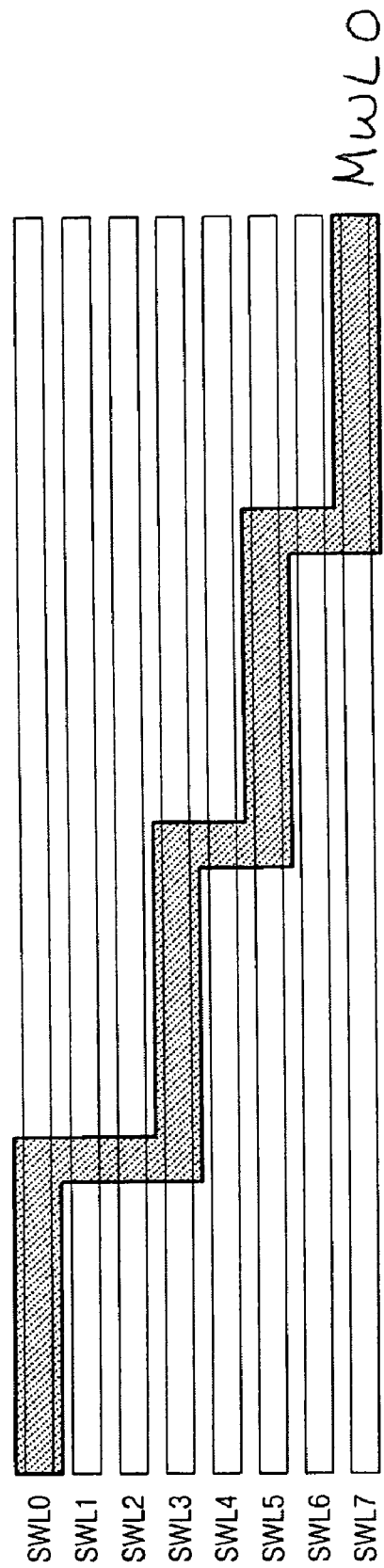

Various shapes of main word lines are illustrated in FIGS. 7 through 10 according to example embodiments. Specifically, a main word line (for example, MWL0) may be formed in a stair shape that sequentially ascends from an eighth sub-word line SWL7 to a first sub-word line SWL0, as illustrated in FIG. 7. Alternatively, the main word line (for example, MWL0) may be formed in a stair shape that sequentially descends from the first sub-word line SWL0 to the eighth sub-word line SWL7, as illustrated in FIG. 8.

Figure 9:
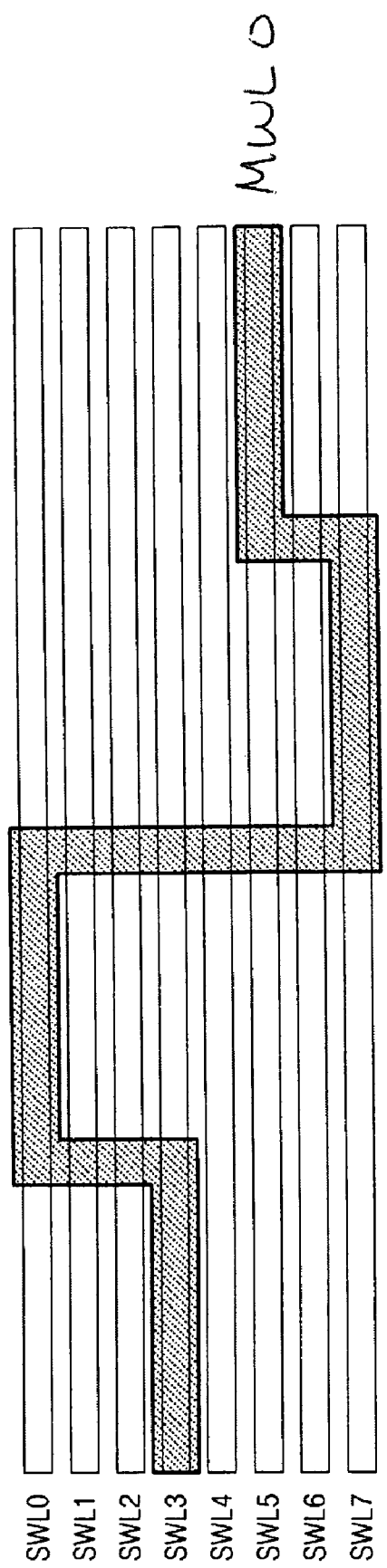
Figure 10:
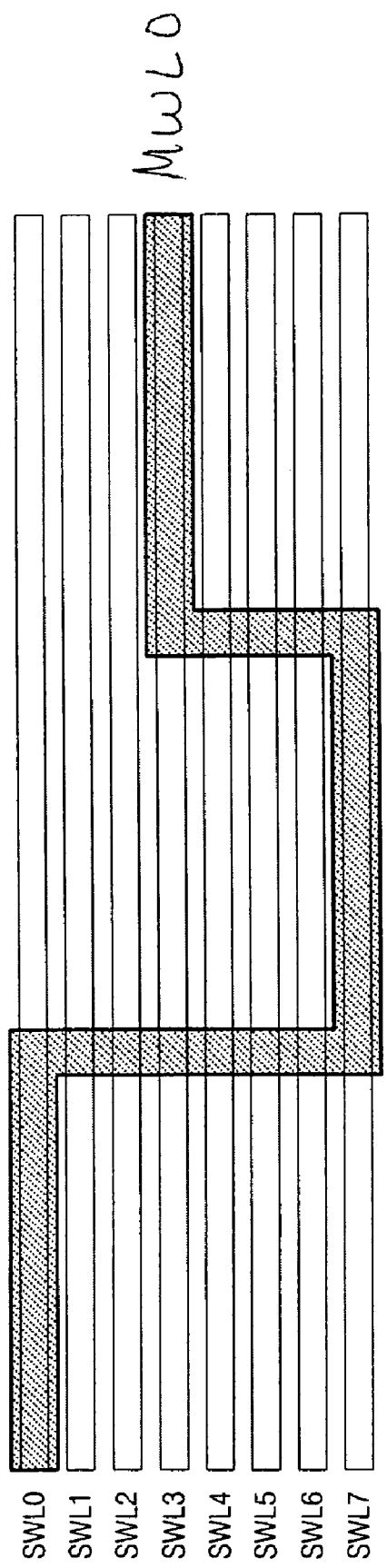

In example embodiments, as illustrated in FIGS. 7 and 8, all of the sub-word lines SWL0 to SWL7 and the main word line MWL do not need to overlap with each other. Similarly, the first sub-word line SWL0 or the eighth sub-word line SWL7 does not need to overlap with the main word line MWL. In addition, the semiconductor memory device illustrated in FIG. 5 may include main word lines having various shapes as illustrated in FIGS. 9 and 10. However, the shape of the main word line of the semiconductor memory device illustrated in FIG. 5 is not limited to the shapes of FIGS. 7 through 10, and also is not limited to eight sub-word lines.

While example embodiments have been particularly shown and described with reference to example embodiments thereof, it will be understood that various changes in form and details may be made therein without departing from the spirit and scope of the following claims.

What is claimed is:

1. A semiconductor memory device comprising:
a plurality of sub-word lines in a first layer;
a plurality of main word lines in a second layer and connected to the corresponding sub-word lines of the plurality of sub-word lines;
a plurality of sub-word line decoders in a layer different from the second layer, connected to the corresponding plurality of sub-word lines and plurality of main word lines, and configured to activate the plurality of sub-word lines corresponding to external addresses and connected to the plurality of sub-word line decoders; and
jump contacts for connecting the plurality of sub-word lines, each of the plurality of sub-word lines is cut to a given length so that the plurality of main word lines can be connected to the plurality of sub-word line decoders in a region in which the corresponding plurality of sub-word line decoders are disposed.

2. The semiconductor memory device of claim 1, wherein the first layer and the second layer are different layers.

3. The semiconductor memory device of claim 1, wherein the first layer and the second layer are formed of a metal.

4. The semiconductor memory device of claim 1, wherein each of the plurality of sub-word lines comprises jump contacts in the same number as the number of the plurality of sub-word lines.

5. The semiconductor memory device of claim 1, wherein at least one main word line of the plurality of main word lines is bent n times (where n is a natural number).

6. The semiconductor memory device of claim 5, wherein n corresponds to the number of the plurality of sub-word lines connected to the respective plurality of main word lines.

7. The semiconductor memory device of claim 6, wherein, when the plurality of main word lines are connected to first through m (where m is a natural number) of the plurality of sub-word lines sequentially disposed, at least one main word line of the plurality of main word lines is in a stair shape that sequentially descends from the first sub-word line to the m-th sub-word line.

8. The semiconductor memory device of claim 6, wherein, when the plurality of main word lines are connected to first through m (where m is a natural number) of the plurality of sub-word lines sequentially disposed, at least one main word line of the plurality of main word lines is in a stair shape that sequentially ascends from the m-th sub-word line to the first sub-word line.

9. The semiconductor memory device of claim 1, wherein the cut region of each of the plurality of sub-word lines is connected in the second layer.

10. The semiconductor memory device of claim 1, wherein the semiconductor memory device is a phase-change random access memory (PRAM) device.

11. A semiconductor memory device comprising:
a plurality of sub-word lines in a first layer; and
a plurality of main word lines in a second layer and connected to corresponding sub-word lines of the plurality of sub-word lines,
wherein at least one main word line of the plurality of main word lines is bent n times (where n is a natural number) to overlap with a portion of each corresponding sub-word line of the plurality of sub-word lines.

12. The semiconductor memory device of claim 11, wherein the first layer and the second layer are different layers.

13. The semiconductor memory device of claim 11, wherein the first layer and the second layer are formed of a metal.

14. The semiconductor memory device of claim 11, wherein n corresponds to the number of the plurality of sub-word lines connected to the respective plurality of main word lines.

15. The semiconductor memory device of claim 14, wherein, when the plurality of main word lines are connected to first through m (where m is a natural number) of the plurality of sub-word lines sequentially disposed, at least one main word line of the plurality of main word lines is in a stair shape that sequentially descends from the first sub-word line to the m-th sub-word line.

16. The semiconductor memory device of claim 14, wherein, when the plurality of main word lines are connected to first through m (where m is a natural number) of the plurality of sub-word lines sequentially disposed, at least one main word line of the plurality of main word lines is in a stair shape that sequentially ascends from the m-th sub-word line to the first sub-word line.

17. The semiconductor memory device of claim 11, wherein each of the plurality of sub-word lines is in a different layer from a layer in which the plurality of main word lines are disposed and cut to a given length so that the plurality of main word lines can be connected to a sub-word line decoder activating the plurality of sub-word lines corresponding to external addresses.

18. The semiconductor device of claim 17, further comprising:
  jump contacts for connecting the plurality of cut sub-word lines.

19. The semiconductor memory device of claim 18, wherein each of the plurality of sub-word lines comprises the jump contacts in the same number as the number of the plurality of sub-word lines.

20. The semiconductor memory device of claim 17, wherein the cut region of each of the plurality of sub-word lines is connected in the second layer.

* * * * *